(12) United States Patent
Zhang

(10) Patent No.: US 8,857,113 B2
(45) Date of Patent: Oct. 14, 2014

(54) LOCKING APPARATUS

(71) Applicants: Hong Fu Jin Precision Industry (ShenZhen) Co., Ltd., Shenzhen (CN); Hon Hai Precision Industry Co., Ltd., New Taipei (TW)

(72) Inventor: Bao-Ren Zhang, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 2 days.

(21) Appl. No.: 13/706,283

(22) Filed: Dec. 5, 2012

(65) Prior Publication Data

US 2014/0091050 A1  Apr. 3, 2014

(30) Foreign Application Priority Data

Sep. 28, 2012  (CN) .................. 2012 1 03667427

(51) Int. Cl.
| | | |
|---|---|---|
| *E04D 13/18* | (2014.01) | |
| *H01L 31/048* | (2014.01) | |
| *H01L 31/042* | (2014.01) | |
| *F16B 9/02* | (2006.01) | |

(52) U.S. Cl.
CPC .......... *H01L 31/048* (2013.01); *H01L 31/0422* (2013.01); *F16B 9/023* (2013.01)
USPC ........................................ 52/173.3; 52/167.5

(58) Field of Classification Search
USPC .............. 52/395, 167.5, 461, 467, 468, 173.3
See application file for complete search history.

(56) References Cited

U.S. PATENT DOCUMENTS

| | | | | | |
|---|---|---|---|---|---|
| 1,513,809 | A | * | 11/1924 | Hawes | 52/395 |
| 3,363,381 | A | * | 1/1968 | Forrest | 52/464 |
| 3,503,166 | A | * | 3/1970 | Lipper et al. | 52/126.6 |
| 3,745,726 | A | * | 7/1973 | Thom et al. | 52/98 |
| 4,984,400 | A | * | 1/1991 | Bockmiller | 52/241 |
| 5,074,089 | A | * | 12/1991 | Kemmer et al. | 52/395 |
| 5,414,967 | A | * | 5/1995 | Cates et al. | 52/281 |
| 6,988,344 | B1 | * | 1/2006 | Krueger | 52/464 |
| 7,143,485 | B2 | * | 12/2006 | Kanie | 24/453 |
| 8,205,923 | B2 | * | 6/2012 | Mourou | 296/1.08 |
| 2008/0277973 | A1 | * | 11/2008 | Mourou | 296/210 |

\* cited by examiner

*Primary Examiner* — Basil Katcheves
(74) *Attorney, Agent, or Firm* — Novak Druce Connolly Bove + Quigg LLP

(57) ABSTRACT

A locking apparatus is used for mounting a photovoltaic module to a rack. The rack includes a base plate, two sidewalls extending from opposite sides of the base plate, and two limiting plates extending in from tops of the sidewalls respectively. An opening is defined between the limiting plates. The locking apparatus includes a pressing member, a mounting member, and a bolt. The mounting member includes a base, a neck portion, a head portion formed on a top of the neck portion, and two arms extending out from opposite sides of the head portion. The base is received in the rack and abuts bottoms of the arms. The arms are blocked by the limiting plates respectively. The bolt extends through the pressing member and the opening to screw into the mounting member, to fix the photovoltaic module between the pressing member and the rack.

18 Claims, 9 Drawing Sheets

LOCKING APPARATUS

CROSS-REFERENCE TO RELATED APPLICATION

Relevant subject matter is disclosed in a pending U.S. patent application Ser. No. 13/690,307 filed on Nov. 30, 2012, and entitled "LOCKING APPARATUS", which is assigned to the same assignee with this patent application.

BACKGROUND

1. Technical Field

The present disclosure relates to locking apparatuses and, particularly, to a locking apparatus for mounting photovoltaic modules.

2. Description of Related Art

Photovoltaic modules are mounted to a bracket through locking apparatuses. A locking apparatus includes a plurality of hexagonal nuts received in a slot of the bracket beforehand, and it is often inconvenient to assemble the hexagonal nuts to the locking apparatus because the hexagonal nuts cannot be guided to be correctly and automatically positioned.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

Figure 1:
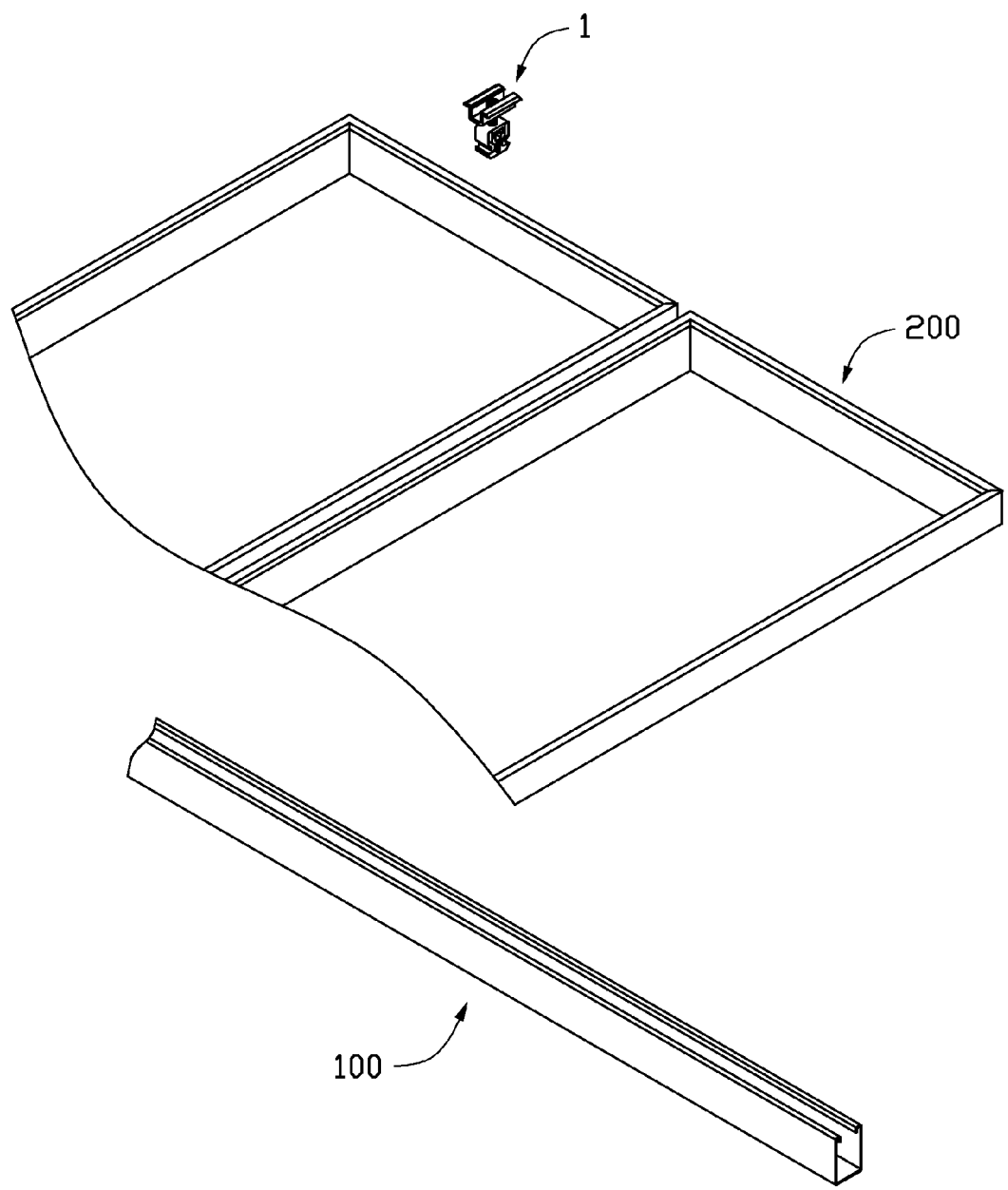
FIG. 1 is an exploded, isometric view of a first embodiment of a locking apparatus, together with a rack and two photovoltaic modules.
Figure 2:
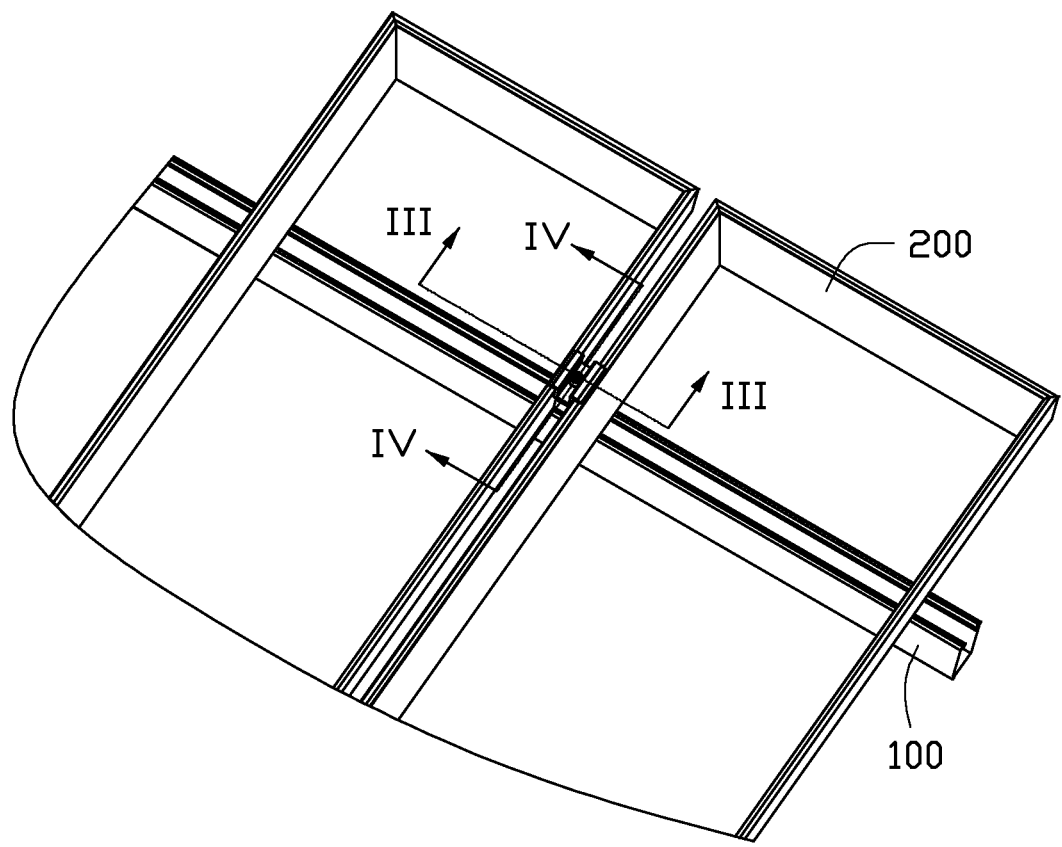
FIG. 2 is an assembled, isometric view of FIG. 1.

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

FIG. 1 to FIG. 4 is an embodiment of a locking apparatus 1 for mounting two photovoltaic modules 200 to a rack 100. The rack 100 includes a bottom wall 101, two sidewalls 102 extending up from opposite sides of the bottom wall 101, and two L-shaped limiting plates 103, first extending inward and then down respectively from tops of the sidewalls 102. An opening 104 is defined between the limiting plates 103.

Figure 5:
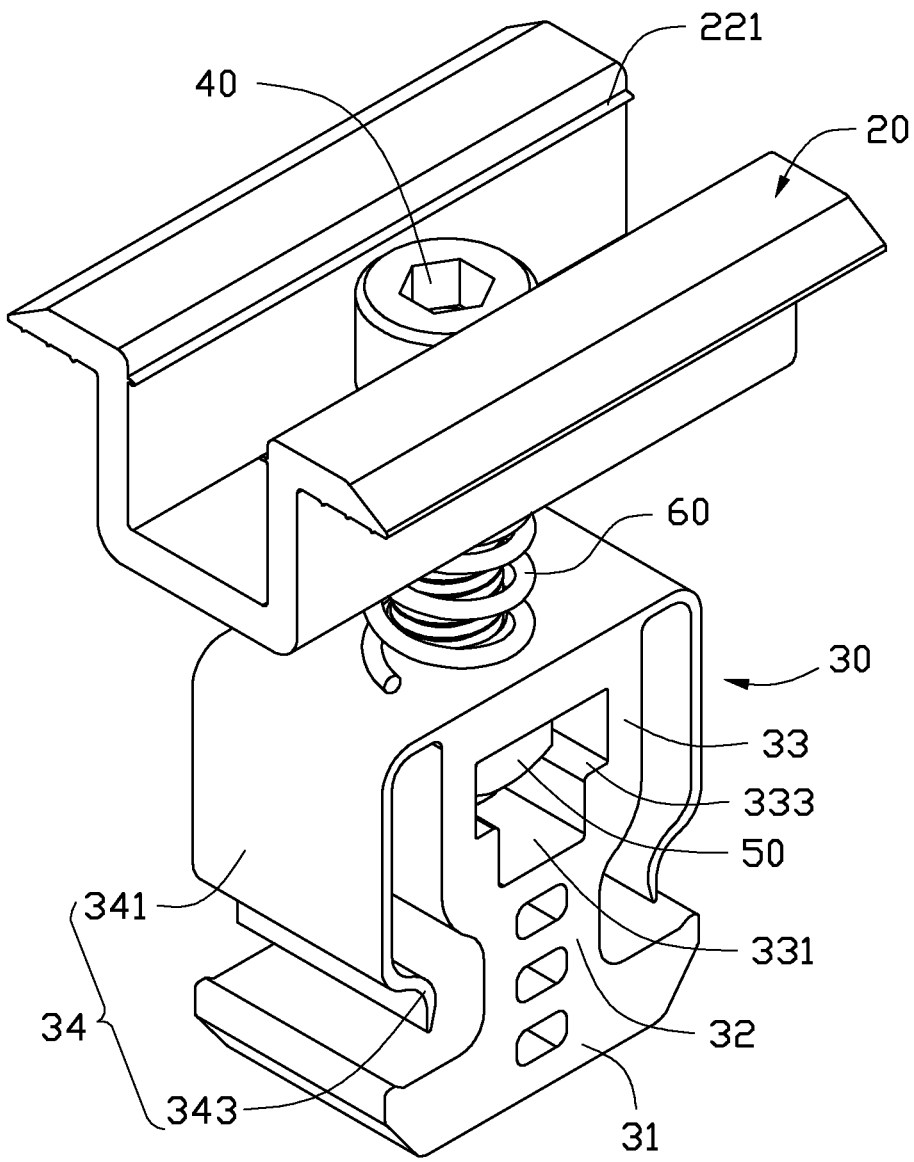
FIG. 5 is an enlarged view of the locking apparatus of FIG. 1.
Figure 6:
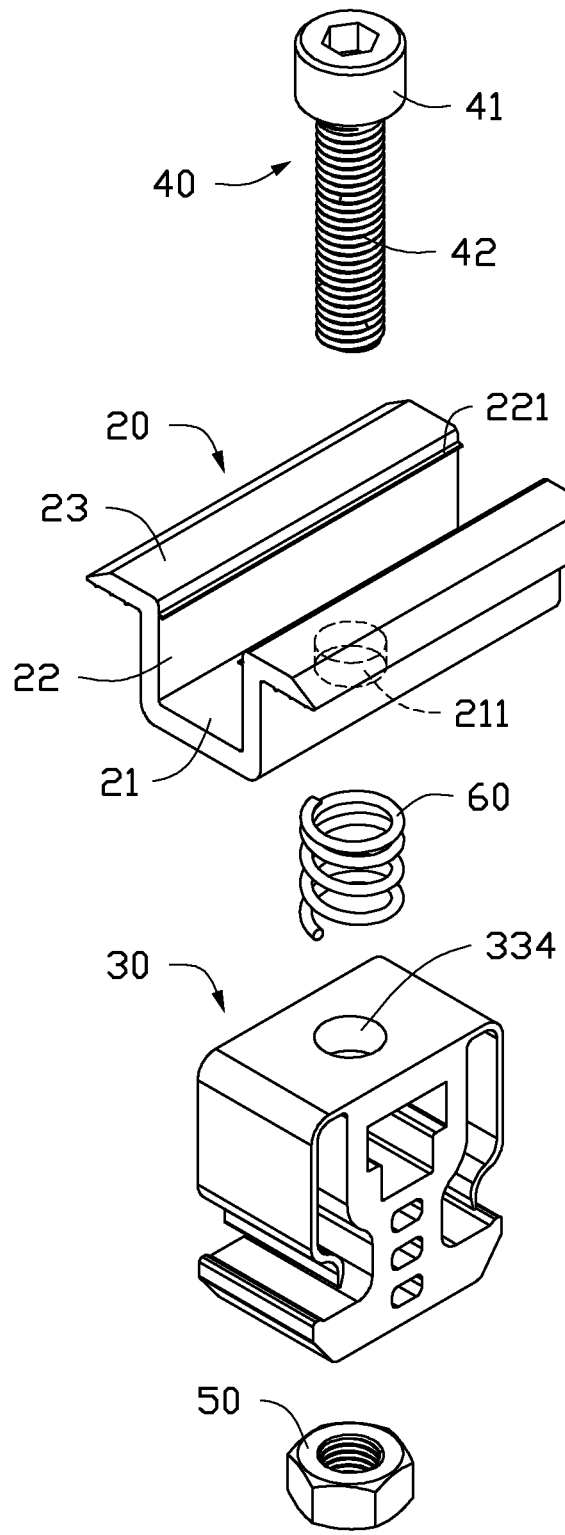
FIG. 6 is an exploded view of the locking apparatus of FIG. 5, wherein the locking apparatus includes a mounting member.

FIG. 5 and FIG. 6 is the locking apparatus 1 of the embodiment. The locking apparatus 1 includes a pressing member 20, a mounting member 30, a bolt 40, a nut 50, and a resilient member 60. In this embodiment, the resilient member 60 is a coil spring.

The pressing member 20 includes a bottom portion 21 and two side portions 22, extending up from opposite sides of the bottom portion 21. A pressing piece 23 extends outward from a top of each side portion 22, away from the other side portion 22. A through hole 211 is defined in a center of the bottom portion 21. An elongated rib 221 extends inward from an inner surface of each side portion 22.

The mounting member 30 includes a rectangular base 31, a neck portion 32 extending up from a middle of the base 31, a head portion 33 extending up from a top of the neck portion 32, and two resilient arms 34, respectively extending outward and down from opposite sides of a top of the head portion 33. A T-shaped through slot 331 is defined in the head portion 32 in a fore-and-aft direction. Two stepped portions 333 are formed at opposite sidewalls bounding the through slot 331. A through hole 334 is defined in the top of the head portion 33 and communicates with the through slot 331. Each resilient arm 34 includes a main plate 341, that is parallel to the left and right sidewalls of the head portion 33, and an L-shaped engaging portion 343, extending inward and down from a lower portion of the main plate 341. The width of the base 31 in the fore-and-aft direction is less than the width of the opening 104. The length of the base 31 is greater than the width of the opening 104. Therefore, the mounting member 30 can be laterally put in the rack 100 through the opening 104.

The bolt 40 includes a head 41 and a threaded portion 42.

In assembly, the mounting member 30 is laterally put into the opening 104 until the base 31 is received in the rack 100. The mounting member 30 is then rotated 90 degrees to make the top of the base 31 abut the bottom of the limiting plates 103. The engaging portions 343 resiliently abut upper portions of inner surfaces of the limiting plates 103. Thus, the neck portion 32 is located in the opening 104. The nut 50 is inserted in the through slot 331 and supported on the stepped portions 333.

The threaded portion 42 extends through the through hole 211, the resilient member 60, and the through hole 334 in that order, to be screwed into the nut 50. The diameter of the head 41 is less than the space between the side portions 22 and greater than the space between the ribs 221. Thus, after the head 41 is inserted between the side portions 22 by deforming the ribs 221 to pass through the ribs 221, the head 41 is located between the bottom portion 21 and the ribs 221, to make the head 41 retain in the pressing member 20.

Figure 3:
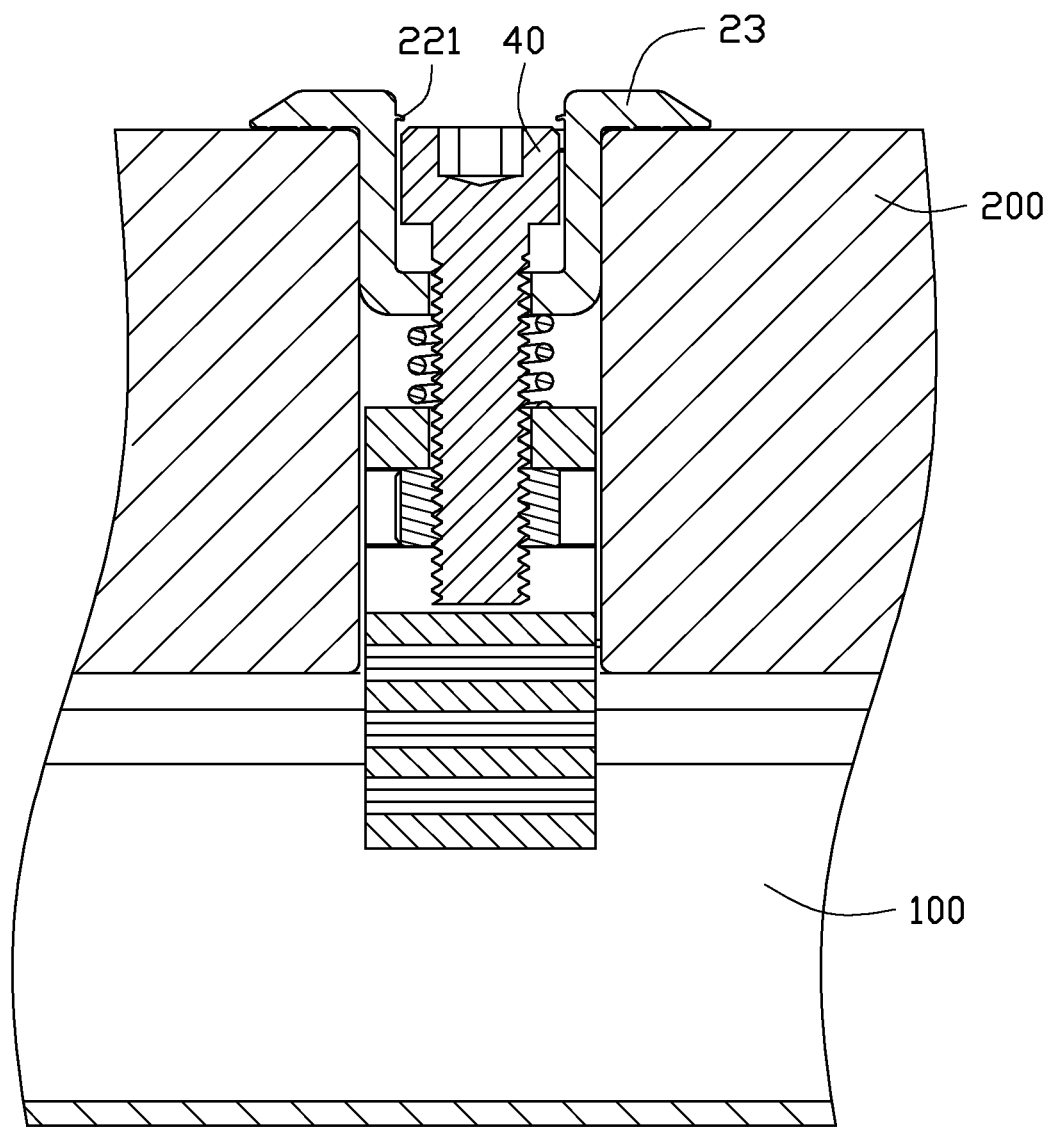
FIG. 3 is a cross-sectional view of FIG. 2, taken along the line of III-III.
Figure 4:
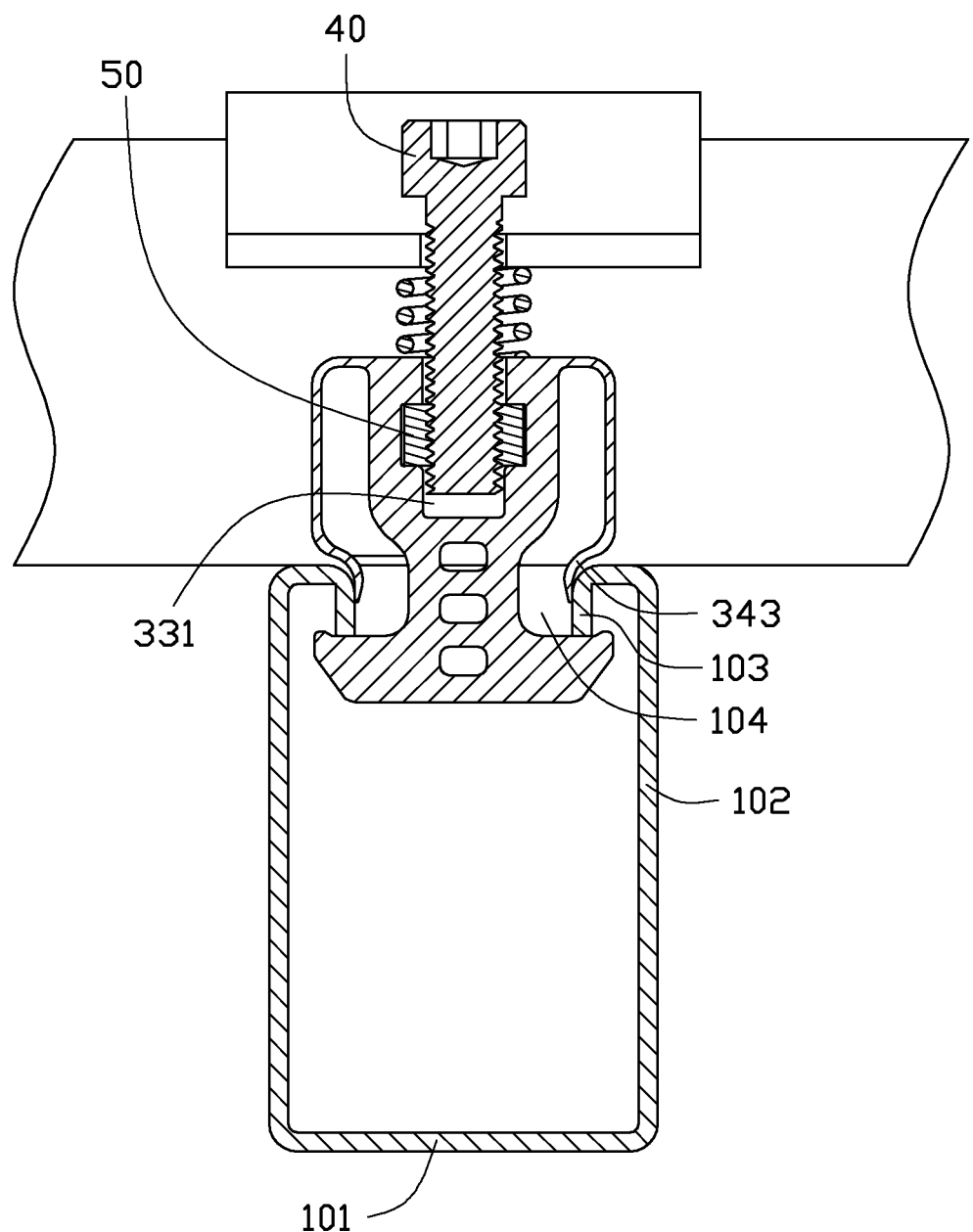
FIG. 4 is a cross-sectional view of FIG. 2, taken along the line of IV-IV.

FIG. 3 shows that the bolt 40 is rotated to be further screwed in the nut 50, to make sides of the photovoltaic modules 200 be firmly sandwiched between the pressing piece 23 and the rack 100. The length of the base 31 is greater than the width of the opening 104, which can prevent the base 31 from releasing from the rack 100. Before assembling the photovoltaic modules 200, the pressing member 20 is attached to the head 41 and located away from the rack 100, which is convenient to insert the photovoltaic modules 200 below the pressing pieces 23.

Figure 7:
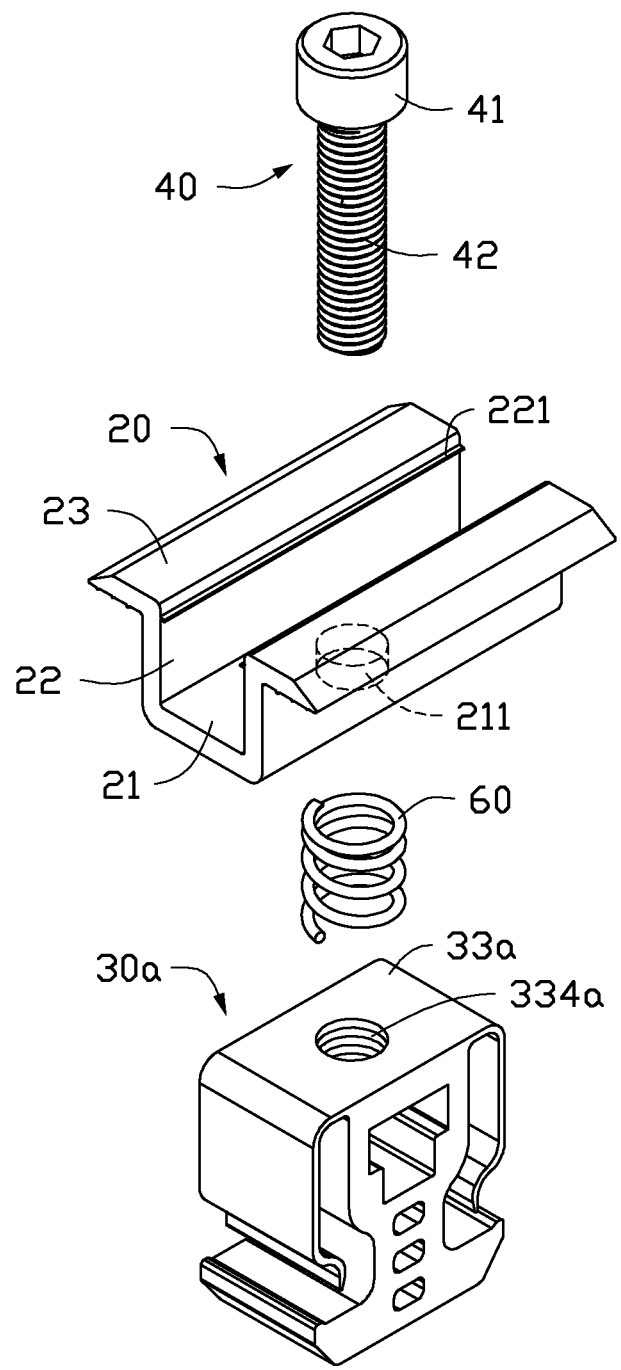
FIG. 7 is an exploded view of a second embodiment of a locking apparatus.

FIG. 7 shows a second embodiment of a locking apparatus. The second embodiment of the locking apparatus includes a mounting member 30a. A screw hole 334a is defined in the top of a head portion 33a. Thus the threaded portion 42 extends through the through hole 211, and the resilient member 60, in that order, to be directly screwed into the screw hole 334a. In this embodiment, a nut 50 is saved.

Figure 8:
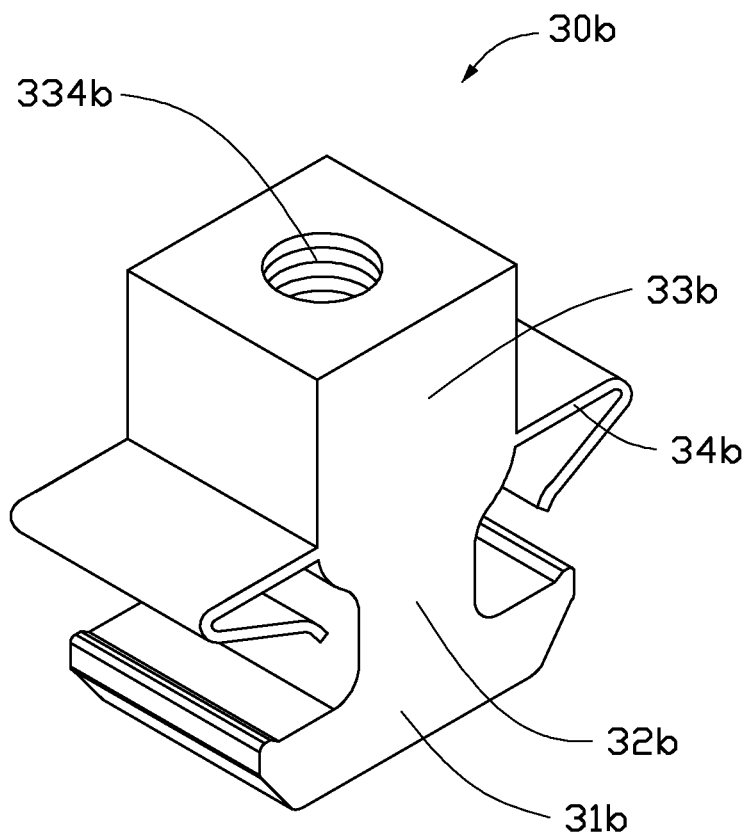
FIG. 8 and FIG. 9 are isometric views of other embodiments of the mounting member of FIG. 6.
Figure 9:
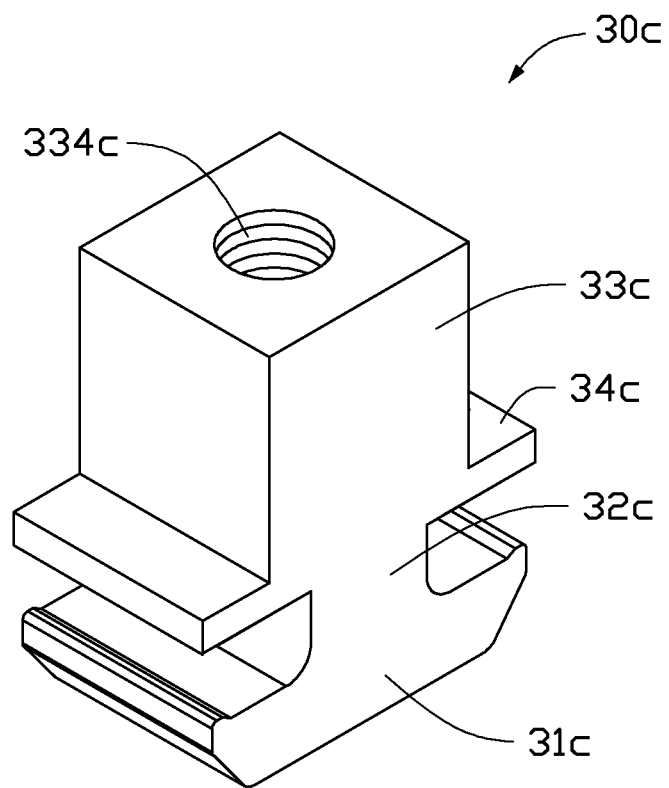

FIG. 8 and FIG. 9 shows that two altered mounting members 30 are shown respectively. The mounting member 30b in FIG. 8 includes a base 31b, a neck portion 32b extending up from a middle of the base 31b, a head portion 33b extending up from a top of the neck portion 32b, and two resilient arms 34b first extending outward and then slantingly inward and down from opposite sides of a top of the head portion 33b. Each arm 34b is substantially V-shaped. A screw hole 334b is defined in the top of the head portion 33b. The width of the base 31b in the fore-and-aft direction is less than the width of the opening 104. The arms 34b resiliently abut upper portions of inner surfaces of the limiting plates 103. The threaded portion 42 extends through the through hole 211, and the resilient member 60 in that order, to be directly screwed into the screw hole 334b.

The mounting member 30c in FIG. 9 includes a base 31c, a neck portion 32c extending up from a middle of the base 31c, a head portion 33c extending up from a top of the neck portion 32c, and two arms 34c respectively extending horizontally from opposite sides of the head portion 33c adjacent to the neck portion 32c. A screw hole 334c is defined in the top of the head portion 33c. The width of the base 31c in the fore-and-aft direction is less than the width of the opening 104. The arms 34c abut upper portions of inner surfaces of the limiting plates 103. The threaded portion 42 extends through the through hole 211, and the resilient member 60 in that order, to be directly screwed into the screw hole 334c.

It is to be understood, however, that even though numerous characteristics and advantages of the embodiments have been set forth in the foregoing description, together with details of the structure and function of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A locking apparatus for mounting a photovoltaic module on a rack, the rack comprising a bottom wall, two sidewalls extending up from opposite sides of the bottom wall, and two limiting plates extending inward and down respectively from tops of the two sidewalls, an opening defined between the two limiting plates, the locking apparatus comprising:
   a pressing member defining a first through hole;
   a bolt comprising a head and a threaded portion; and
   a mounting member, wherein the mounting member comprises a base, a neck portion extending up from a middle of the base, a head portion extending up from a top of the neck portion, and two arms respectively extending outward from opposite sides of the head portion;
   wherein the neck portion of the mounting member is received in the opening, a top of the base abuts bottoms of the limiting plates, the arms abut inner surfaces of the limiting plates, the threaded portion extends through the first through hole, and the opening of the rack to be screwed into the mounting member, wherein a through slot is defined in the head portion, a second through hole is defined in a top of the head portion and communicates with the through slot, a nut is received in the second through hole; and the threaded portion extends through the first through hole, the opening of the rack, and the second through hole, in that order, to be screwed into the nut, wherein two stepped portions are formed at opposite sidewalls bounding the through slot, and the nut is supported on the two stepped portions.

2. The locking apparatus of claim 1, wherein the pressing member comprises a bottom portion and two side portions extending up from opposite sides of the bottom portion, wherein two pressing pieces extend outward from tops of the two side portions respectively, and the first through hole is defined in a center of the bottom portion.

3. The locking apparatus of claim 2, wherein two ribs extend inward from the two side portions respectively, a distance between the two ribs is less than a diameter of the head, and the head is retained in the pressing member between the two ribs and the bottom portion.

4. The locking apparatus of claim 2, wherein a resilient member is set around the threaded portion and located between the bottom portion of the pressing member and the mounting member.

5. The locking apparatus of claim 1, wherein each arm comprises a main plate parallel to left and right sidewalls of the head portion and an engaging portion extending inward and down from a lower portion of the main plate, and the engaging portions abut upper portions of the two limiting plates respectively.

6. The locking apparatus of claim 1, wherein each arm extends horizontally from opposite sidewalls of the head portion and abuts corresponding upper portion of the corresponding limiting plate.

7. The locking apparatus of claim 1, wherein a width of the base is less than a width of the opening, and a length of the base is greater than the width of the opening.

8. The locking apparatus of claim 1, wherein a screw hole is defined at the top of the head portion, the threaded portion extends through the first through hole, and the opening, in that order, to be directly screwed into the screw hole.

9. An assembly, comprising:
   a rack comprising a bottom wall, two sidewalls extending up from opposite sides of the bottom wall, and two limiting plates extending inward and down respectively from tops of the two sidewalls, an opening defined between the two limiting plates;
   a photovoltaic module rested on the rack with a side;
   a pressing member defining a first through hole;
   a bolt comprising a head and a threaded portion; and
   a mounting member, wherein the mounting member comprises a base, a neck portion extending up from a middle of the base, a head portion extending up from a top of the neck portion, and two arms respectively extending outward from opposite sides of the head portion;
   wherein the neck portion of the mounting member is received in the opening, a top of the base abuts bottoms of the two limiting plates, the two arms abut inner surfaces of the two limiting plates, the threaded portion extends through the first through hole and the opening of the rack to be screwed into the mounting member, thus the side of the photovoltaic module is firmly sandwiched between the pressing member and the rack.

10. The assembly of claim 9, wherein the pressing member comprises a bottom portion and two side portions extending up from opposite sides of the bottom portion, wherein two pressing pieces extend outward from tops of the two side portions respectively, the first through hole is defined in a center of the bottom portion.

11. The assembly of claim 10, wherein two ribs extend inward from the two side portions respectively, a distance between the two ribs is less than a diameter of the head, the head is retained in the pressing member between the two ribs and the bottom portion.

12. The assembly of claim 10, wherein a resilient member is set around the threaded portion and located between the bottom portion of the pressing member and the mounting member.

13. The assembly of claim 9, wherein a through slot is defined in the head portion, a second through hole is defined in a top of the head portion and communicates with the through slot, a nut is received in the second through hole, the threaded portion extends through the first through hole, the opening of the rack, and the second through hole in that order, to be screwed into the nut.

14. The assembly of claim 13, wherein two stepped portions are formed at opposite sidewalls bounding the through slot, the nut is supported on the two stepped portions.

15. The assembly of claim 9, wherein each arm comprises a main plate parallel to left and right sidewalls of the head portion and an engaging portion extending inward and down from a lower portion of the main plate, the engaging portions abut upper portions of the two limiting plates.

16. The assembly of claim 9, wherein each arm extend horizontally from opposite sidewalls of the head portion, and abuts corresponding upper portions of the two limiting plates.

17. The assembly of claim 9, wherein a width of the base is less than a width of the opening, and a length of the base is greater than the width of the opening.

18. The assembly of claim 9, wherein a screw hole is defined in a top of the head portion, the threaded portion extends through the first through hole, and the opening, in that order, to be directly screwed into the screw hole.

* * * * *